United States Patent
Takano

(10) Patent No.: US 7,733,150 B2
(45) Date of Patent: Jun. 8, 2010

(54) METHOD AND APPARATUS FOR ADAPTIVE CLOCK PHASE CONTROL FOR LSI POWER REDUCTION

(75) Inventor: Chiaki Takano, Austin, TX (US)

(73) Assignee: Sony Computer Entertainment Inc., Tokyo (JP)

( * ) Notice: Subject to any disclaimer, the term of this patent is extended or adjusted under 35 U.S.C. 154(b) by 0 days.

(21) Appl. No.: 12/192,385

(22) Filed: Aug. 15, 2008

(65) Prior Publication Data

US 2010/0039152 A1 Feb. 18, 2010

(51) Int. Cl.
*G06F 1/04* (2006.01)
(52) U.S. Cl. ........................ 327/291; 327/295
(58) Field of Classification Search ........................ None
See application file for complete search history.

(56) References Cited

U.S. PATENT DOCUMENTS

| 5,272,729 | A | * | 12/1993 | Bechade et al. | ............. 375/371 |
| 6,166,990 | A | * | 12/2000 | Ooishi et al. | ........... 365/233.11 |
| 6,232,806 | B1 | * | 5/2001 | Woeste et al. | ............... 327/149 |

* cited by examiner

*Primary Examiner*—Cassandra Cox
(74) *Attorney, Agent, or Firm*—Matthew B. Dernier, Esq.; Gibson & Dernier LLP

(57) ABSTRACT

Methods and apparatus for distributing a clock signal to a digital circuit provide for: producing a clock signal; and delaying, advanced, or leaving the clock signal unchanged to produce an output clock signal as a function of a control signal, wherein an amount of delay or advancement between the clock signal and the output clock signal (phase difference) is a function of time variant changes in a magnitude of a power supply voltage to the digital circuit.

11 Claims, 3 Drawing Sheets

100

Control signal

106

METHOD AND APPARATUS FOR ADAPTIVE CLOCK PHASE CONTROL FOR LSI POWER REDUCTION

BACKGROUND

The present invention relates to improving the permitted amount of nominal signal delay through an LSI circuit.

In conventional systems, a system clock signal is often used by digital circuitry, such as digital circuitry implemented using a LSI circuit, to synchronously execute certain logic functions. For example, ultra-deep sub-micron (UDSM) microprocessors employ digital circuitry that uses system clock signals to synchronously execute logic functions. These microprocessors operate at system clock frequencies of 1-10 GHz and higher. The system clock signal of a given LSI circuit is often split into many paths to service many different portions of the digital circuitry.

Complex LSI circuits include multiple distinct circuit areas, each with its own path from input to output, and each with the need for a system clock signal to clock the signals through digital circuitry. Depending on the function of the LSI, some circuit areas are cascaded in series and others are arranged in parallel. In general, in order for the circuit areas to operate properly, the synchronous design of the LSI must satisfy the following condition between clock cycle time (T) and circuit delay time (D): $T \geq D$. In practice, the clock cycle time of the system clock should be significantly greater than the delay of a signal through a given circuit area of the LSI.

The problem in prior art LSI circuits is that variations in the power supply voltage of the LSI have a negative effect on the permitted nominal signal delay through the LSI circuit. This results in higher power consumption in the LSI and has placed a burden on designers of LSI circuits to keep the nominal signal delay as small as possible, thereby driving up costs.

SUMMARY OF THE INVENTION

In the presence of power supply noise, the nominal signal delay through the LSI circuit must be lower than if the power supply noise did not exist. When the power supply voltage is constant, the circuit delay time can be considered constant. However, in real systems, internal and external interferences cause power supply noise. Thus the circuit delay time D may be considered as a function of the power supply voltage (v), which results in the following relationship:

$$T \geq \max\{D(v)\}$$
$$\geq D_0 + \max\left\{\frac{\partial D}{\partial v}(v - v_0)\right\}$$

where $D_0$ is nominal circuit delay time, $v_0$ is nominal power supply voltage. From the above equation, it has been discovered that the clock cycle time becomes larger due to power supply noise. In other words, to obtain the same clock cycle time in the presence of power supply noise, the nominal delay time $D_0$ has to be smaller. Consequently, the LSI circuits must have a higher nominal power supply voltage to reduce the nominal circuit delay time. This results in higher power consumption.

In accordance with one or more embodiments of the present invention, an LSI circuit may be designed with higher nominal signal delay (which is easier to design, less costly, and of lower power consumption) by controlling the phase of the clock signal distributed through the LSI as a function of time. The phase of the clock signal is controlled as a function of the variation in the power supply voltage. The time-variant, control relationship between the phase of the clock signal (in radians) as a function of the variation in the power supply voltage, may be expressed as follows:

$$\varphi(t) = -\frac{\beta}{T_0} \int (v(t) - v_0) dt$$

The variable $T_0$ is the clock cycle time and $\beta$ is a constrained constant. The amount of phase increase or decrease (delay time added to or subtracted from the system clock) may be limited in order to account for LSI area limitations, transistor number limitations, power limitations, and so on. Thus the constrained constant $\beta$ is employed to so limit the phase change, which may be expressed as follows:

$$d\max \geq \frac{\beta}{2\pi} \max\left|\int (v(t) - v_0) dt\right|$$
$$\beta \leq \frac{2\pi d\max}{\max\left|\int (v(t) - v_0) dt\right|}$$

where dmax is the maximum delay time permitted to be added to or subtracted from the system clock.

In accordance with one or more embodiments of the present invention, a clock distribution circuit includes: a clock source operable to produce a clock signal; a phase adjustment circuit operable to receive the clock signal and produce a delayed, advanced, or unchanged output clock signal as a function of a control signal; and a clock distribution tree operable to distribute the delayed clock signal to a plurality of areas of a digital circuit, wherein the phase adjustment circuit is operable to vary an amount of delay or advancement between the clock signal and the output clock signal (phase difference) as a function of time variant changes in a magnitude of a power supply voltage to the digital circuit.

The phase adjustment circuit is operable to vary the phase difference between the clock signal and the output clock as expressed by the following equation:

$$\varphi(t) = -\frac{\beta}{T_0} \int (v(t) - v_0) dt,$$

wherein $\phi(t)$ is the phase difference in radians as a function of time variant changes in a magnitude of the power supply voltage v(t), $T_0$ is a cycle time of the clock signal and $\beta$ is a constrained constant.

$\beta$ is constrained limit the permissible phase difference in accordance with the following expression:

$$d\max \geq \frac{\beta}{2\pi} \max\left|\int (v(t) - v_0) dt\right|$$
$$\beta \leq \frac{2\pi d\max}{\max\left|\int (v(t) - v_0) dt\right|}$$

where dmax is a maximum quantity of time permitted to be added to or subtracted from the clock signal.

The phase adjustment circuit includes: a sensing circuit operable to produce a noise signal indicative of the time variant changes in the magnitude of the power supply voltage; a low frequency cut-off (or band-pass) circuit operable to produce a filtered version of the noise signal; an integrator circuit operable to produce an integral of the filtered noise signal as a function of time; and a gain circuit operable to produce the control signal from the integral of the filtered noise signal.

The power supply circuit has a chip, package, and/or board parasitic LCR resonance frequency as a function of stray inductances and capacitances within the power supply circuit; and a cut-off frequency of the low frequency cut-off circuit is set below the LCR resonance frequency such that β is larger than would otherwise be possible when the cut-off frequency of the low frequency cut-off circuit is set above the LCR resonance frequency.

In accordance with one or more further embodiments of the present invention, a method of distributing a clock signal to a digital circuit includes: producing a clock signal; and delaying, advanced, or leaving the clock signal unchanged to produce an output clock signal as a function of a control signal, wherein an amount of delay or advancement between the clock signal and the output clock signal (phase difference) is a function of time variant changes in a magnitude of a power supply voltage to the digital circuit.

The method may further include distributing the output clock signal to a plurality of areas of an digital circuit using a clock distribution tree.

The phase difference between the clock signal and the output clock is expressed by the following equation:

$$\varphi(t) = -\frac{\beta}{T_0} \int (v(t) - v_0) dt,$$

wherein φ(t) is the phase difference in radians as a function of time variant changes in a magnitude of the power supply voltage v(t), $T_0$ is a cycle time of the clock signal and β is a constrained constant.

The method may further include: producing a noise signal indicative of the time variant changes in the magnitude of the power supply voltage; producing a filtered version of the noise signal; and integrating the filtered noise signal as a function of time to produce a signal indicative of the control signal.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

DETAILED DESCRIPTION OF THE PRESENT INVENTION

Figure 1:
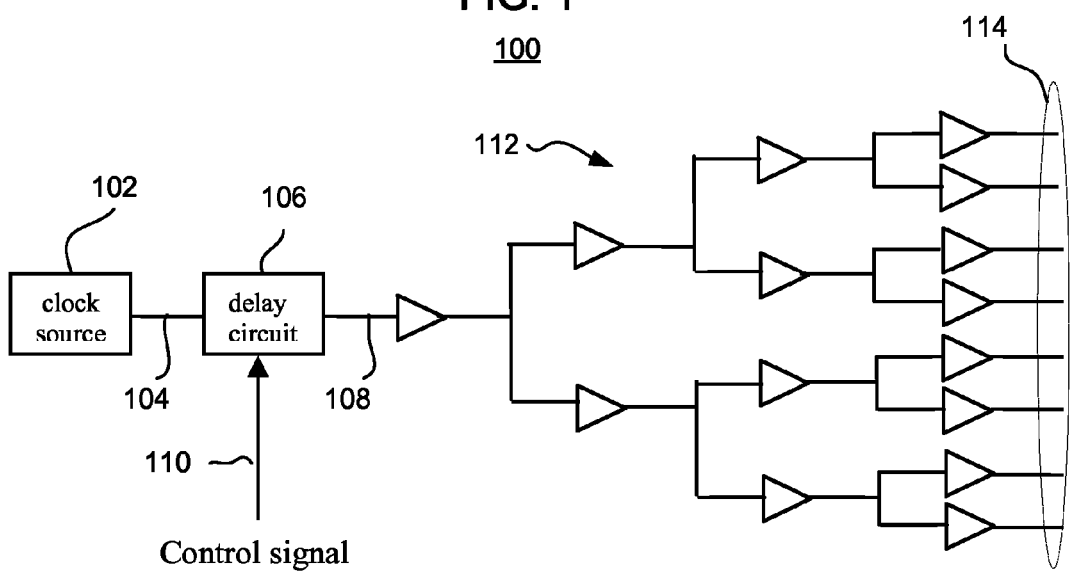
FIG. 1 is a block diagram of a clock distribution circuit for a digital circuit in accordance with one or more aspects of the present invention.

With reference to the drawings, wherein like numerals indicate like elements, there is shown in FIG. 1 a system 100 for distributing a clock signal to a digital circuit (such as a large scale integrated circuit, LSI circuit) in accordance with one or more embodiments of the present invention. The system 100 includes a clock source 102, a phase adjustment (delay) circuit 106, and a clock distribution tree 112. The clock source 102 is operable to produce a clock signal 104 of a suitable frequency for use by the digital circuit. The phase adjustment circuit 106 is operable to receive the clock signal 104 and produce a delayed, advanced, or unchanged output clock signal 108 as a function of a control signal 110. The clock distribution tree 112 fans out the clock signal 108 to various parts of the digital circuit and provides a local clock signal 114 at each location.

The phase of the output clock signal 108 with respect to the clock signal 104 is controlled as a function of the variation in the power supply voltage to the digital circuit. The time-variant, control relationship between the phase of the output clock signal 108 (in radians) as a function of the variation in the power supply voltage, may be expressed as follows:

$$\varphi(t) = -\frac{\beta}{T_0} \int (v(t) - v_0) dt$$

where the variable $T_0$ is the clock cycle time and β is a constrained constant.

As discussed above, in the presence of power supply noise, the nominal signal delay through the digital circuit must be lower than if the power supply noise did not exist. Since the clock cycle time becomes smaller due to power supply noise, in order to obtain the same clock cycle time the nominal delay time $D_0$ has to be smaller. The phase adjustment circuit 106 permits the digital circuit to be designed with larger nominal signal delay (which is easier to design, less costly, and of lower power consumption) by controlling the phase of the clock signal 108 distributed through the digital circuit.

The time-variant, control relationship between the phase of the output clock signal 108 (in radians) as a function of the variation in the power supply voltage is obtained as follows. The phase of the clock signal 108 at time t is expressed as ωt−φ or 2πft−φ. The clock cycle time T can be expressed using the following equation: {ω·(t+T)−φ}−{ωt−φ}=2π. The conventional clock generation methods have been directed to keeping φ constant in order to obtain a stable clock cycle time. According to one or more embodiments of the invention, however, φ is intentionally controlled, changed and adapted to result in lower nominal power supply voltage for a given nominal clock cycle time $T_0$.

The phase shift term φ is assumed to be a varying quantity as a function of time t because it is intentionally controlled. Therefore, the clock cycle time T can be expressed as:

$$\{\omega \cdot (t+T) - \varphi(t+T)\} - \{\omega t - \varphi(t)\} = 2\pi$$

$$T = \frac{2\pi + \Delta\varphi(t)}{\omega}$$

$$= T_0 + \frac{\Delta\varphi(t)}{\omega}$$

where $$\Delta\varphi(t) \equiv \varphi(t+T) - \varphi(t)$$

In order to make sure that the digital circuit (such as an LSI circuit) works normally, the following equation must be valid:

$$T(t) \geq D(t)$$

$$T_0 + \frac{\Delta\varphi(t)}{\omega} \geq D_0 + \frac{\partial D}{\partial v}(v(t) - v_0)$$

$$T_0 \geq D_0 + \max\left\{\frac{\partial D}{\partial v}(v(t) - v_0) - \frac{\Delta\varphi(t)}{\omega}\right\}$$

From the above equation, when the $$\max\left\{\frac{\partial D}{\partial v}(v(t) - v_0) - \frac{\Delta\varphi(t)}{\omega}\right\}$$

is smaller than $$\max\left\{\frac{\partial D}{\partial v}(v(t) - v_0)\right\},$$

the nominal circuit delay time $D_0$ can be larger. In accordance with one aspect of the present invention, a method minimizes $$\max\left\{\frac{\partial D}{\partial v}(v(t) - v_0) - \frac{\Delta\varphi(t)}{\omega}\right\}$$

to control $\Delta\phi(t)$ as a proportional function of $v(t)-v_0$. Here, we consider the condition of $\Delta\phi(t) \equiv -\beta \cdot (v(t)-v_0)$ ($\beta>0$). Then, the following equation results:

$$\max\left\{\frac{\partial D}{\partial v}(v(t) - v_0) - \frac{\Delta\varphi(t)}{\omega}\right\} =$$

$$\max\left\{\frac{\partial D}{\partial v}(v(t) - v_0) + \frac{\beta}{\omega}(v(t) - v_0)\right\} = \max\left\{\left(\frac{\partial D}{\partial v} + \frac{\beta}{\omega}\right) \cdot (v(t) - v_0)\right\}$$

$\frac{\partial D}{\partial v}$ is negative value, and $\frac{\beta}{\omega}$ is positive value, so $\max\left\{\left(\frac{\partial D}{\partial v} + \frac{\beta}{\omega}\right) \cdot (v(t) - v_0)\right\}$ is smaller than $\max\left\{\frac{\partial D}{\partial v}(v(t) - v_0)\right\}$.

From the above, it is clear that controlling $\Delta\phi(t)$ as a proportional function of $v(t)-v_0$ permits the nominal circuit delay time $D_0$ to be longer than otherwise possible. In other words, a given clock frequency may be achieved with lower nominal power supply voltage to the digital circuit.

Accordingly, in order to control φ(t) as a function of v(t):

$$\Delta\varphi(t) \equiv \varphi(t+T) - \varphi(t) \cong \varphi(t+T_0) - \varphi(t)$$

$$\Delta\varphi(t) \approx \frac{d\varphi}{dt} \cdot T_0$$

Then the relation between φ(t) and v(t) is:

$$\frac{d\varphi}{dt} \cdot T_0 = -\beta \cdot (v(t) - v_0)$$

$$\varphi(t) = -\frac{\beta}{T_0}\int (v(t) - v_0) dt.$$

Figure 2:
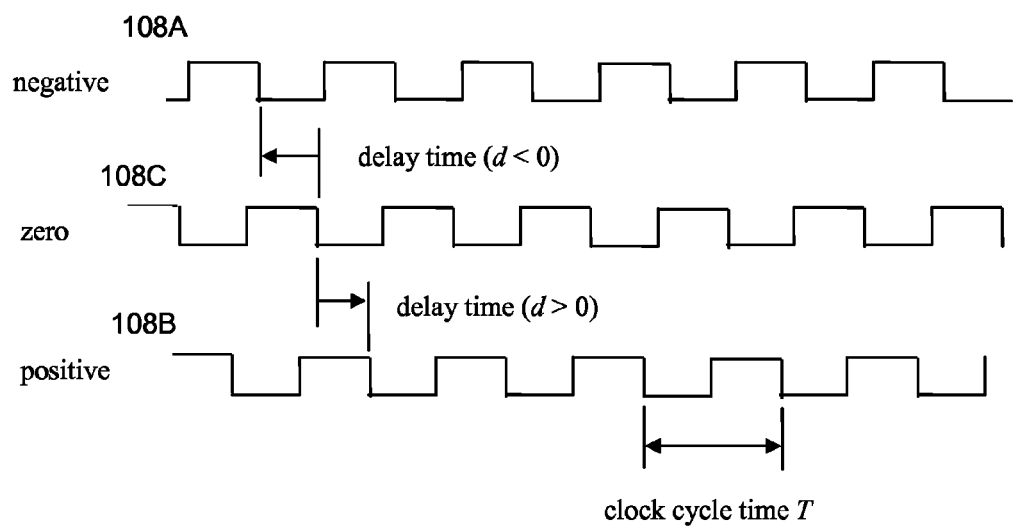
FIG. 2 contains timing diagrams illustrating relationships between clock signals that are produced by the clock distribution circuit of FIG. 1.

With reference to FIG. 2, timing diagrams are illustrated showing some of the dynamically changing clock signals 108 that may be produced by the phase adjustment circuit 106 as a function of the control signal 110. The phase relationships between a nominal clock signal 108C (which has been defined as zero phase shift), a theoretically maximally advanced clock signal 108A (delay, d<0) with respect to signal 108C, and a theoretically maximally delayed clock signal 108B (delay, d>0) with respect to signal 108C. Thus, the range of phase advance and/or delay between signal 108A to 108B, with the center being at signal 108C is produced by the phase adjustment circuit 106 as a function of the control signal 110.

The amount of phase increase or decrease (delay time added to or subtracted from the system clock) may be limited in order to account for LSI area limitations, transistor number limitations, power limitations, and so on. The relationship between the delay time (d), where the delay may be d<0 (advancing) or d>0 (lagging), introduced by the phase adjustment circuit 106 may be expressed as:

$$\varphi = 2\pi \cdot \frac{d}{T_0}$$

$$2\pi \cdot \frac{d(t)}{T_0} = -\frac{\beta}{T_0}\int (v(t) - v_0) dt$$

$$d(t) = -\frac{\beta}{2\pi}\int (v(t) - v_0) dt$$

Thus the constrained constant β is employed to so limit the phase change, which may be expressed as follows:

$$d\max \geq \frac{\beta}{2\pi}\max\left|\int (v(t) - v_0) dt\right|$$

$$\beta \leq \frac{2\pi d\max}{\max\left|\int (v(t) - v_0) dt\right|}$$

where dmax is the maximum delay time permitted to be added to or subtracted from the system clock.

Figure 3:
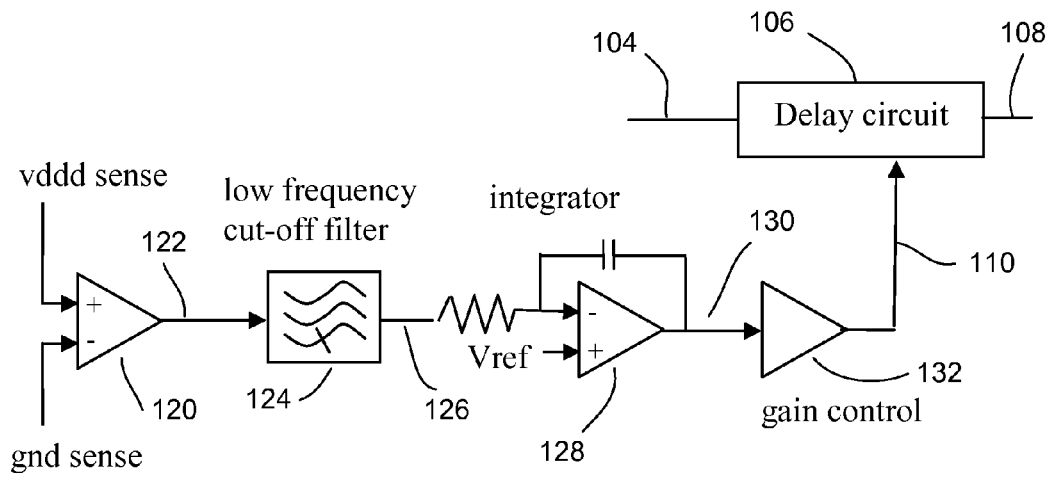
FIG. 3 is a block diagram of a phase adjustment circuit operable to receive a clock signal and produce a delayed, advanced, or unchanged output clock signal as a function of a control signal.

Reference is now made to FIG. 3, which is a block diagram of a system suitable for controlling the phase adjustment circuit 106. The circuit includes a sensing circuit 120, a low frequency cut-off (filter) circuit 124, an integrator circuit 128, and optionally a gain circuit 132. The sensing circuit 120 is operable to produce a noise signal 122 indicative of the time variant changes in the magnitude of the power supply voltage.

By way of example, the sensing circuit 120 may be implemented using a differential amplifier establishing a difference between the signal on the power supply voltage line (Vddd) and ground (gnd). The low frequency cut-off circuit 124 is operable to produce a filtered version of the noise signal 126, which either eliminates or significantly attenuates frequencies below a cut-off frequency. In an alternative embodiment, the low frequency cut-off circuit 124 may be considered broadly to be a high-pass filter or a band-pass filter. The integrator circuit 128 is operable to produce an integral 130 of the filtered noise signal 126 as a function of time. The gain circuit 132 is operable to produce the control signal 110 from the integral 130 of the filtered noise signal 126.

Figure 4:
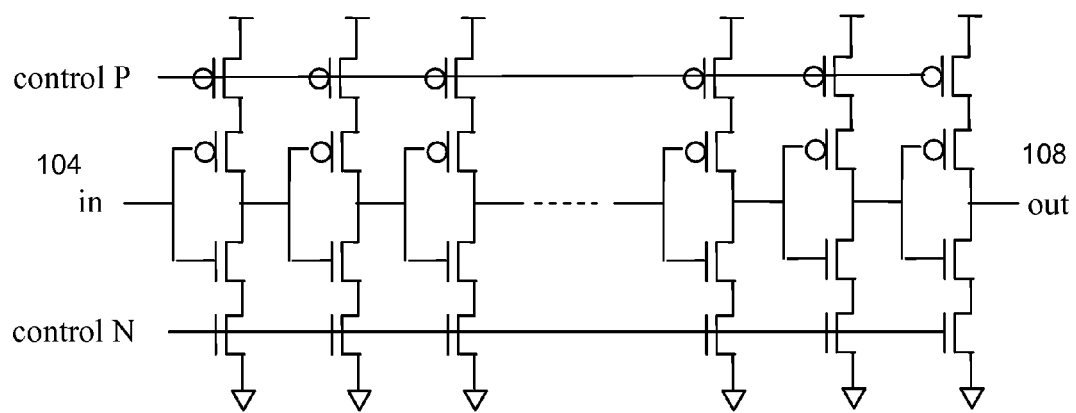
FIG. 4 is a detailed circuit schematic suitable for implementing a voltage controlled delay circuit of the phase adjustment circuit of FIG. 3.

FIG. 4 illustrates a detailed circuit schematic suitable for implementing the voltage controlled delay circuit of the phase adjustment circuit 106 of FIG. 3.

Figure 5:
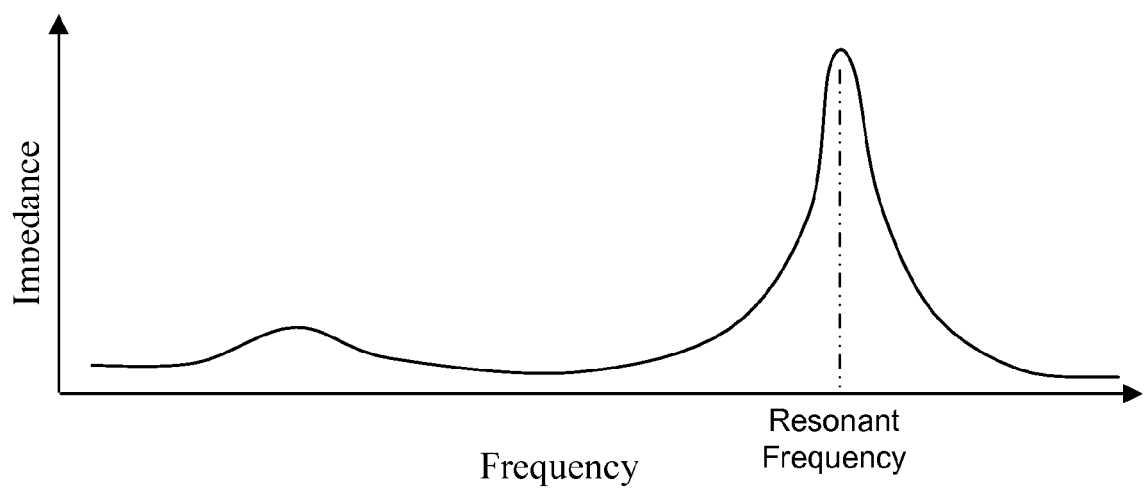
FIG. 5 is a chart illustrating relationships between impedance and frequency within a digital circuit and showing a resonance condition.

FIG. 5 illustrates the relationship between the impedance and frequency within a power supply circuit. The power supply circuit has a chip, package, and/or board parasitic LCR resonance frequency, which results from stray inductances and capacitances within the power supply circuit. As discussed above, the phase shift constraint, β is limited:

$$\beta \le \frac{2\pi d\max}{\max|\int(v(t)-v_0)dt|}$$

From the equation, it is evident that the low frequency components of v(t) result in a large change in the integral 130. For high performance microprocessor LSIs, the power supply voltage noise may be caused by the chip, package, and/or board parasitic LCR resonance. In general, the power supply voltage has significant (and possibly maximum) noise when the frequency of the change of power supply current due to the workload running on the LSI matches the resonant frequency established by the chip, package, and/or board parasitic LCR. FIG. 5 shows the typical power supply impedance as a function of frequency—with the peak being centered at the resonant frequency established by the chip, package, and/or board parasitic LCR.

By setting the cut-off frequency of the low frequency cut-off circuit 124 below the LCR resonance frequency, the denominator of the constraint equation max|∫(v(t)−v_0)dt| will become smaller. This results in a larger β and larger amount of permissible clock phase shift. Thus, β is larger than would otherwise be possible when the cut-off frequency of the low frequency cut-off circuit is set above the LCR resonance frequency.

It is noted that the methods and apparatus described thus far and/or described later in this document may be achieved utilizing any of the known technologies, such as standard digital circuitry, analog circuitry, microprocessors, digital signal processors, any of the known processors that are operable to execute software and/or firmware programs, programmable digital devices or systems, programmable array logic devices, or any combination of the above, including devices now available and/or devices which are hereinafter developed.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A clock distribution circuit, comprising:
   a clock source that operates to produce a clock signal;
   a phase adjustment circuit that operates to receive the clock signal and produce a delayed, advanced, or unchanged output clock signal as a function of a control signal, and which operates to vary the phase difference between the clock signal and the output clock in a way that adheres to the following equation:

$$\varphi(t) = -\frac{\beta}{T_0}\int(v(t)-v_0)dt$$

where φ(t) is the phase difference in radians as a function of time variant changes in a magnitude of the power supply voltage v(t), $T_0$ is a cycle time of the clock signal and β is a constrained constant; and
   a clock distribution tree that operates to distribute the output clock signal to a plurality of areas of a digital circuit,
   wherein the phase adjustment circuit is that operates to vary an amount of delay or advancement between the clock signal and the output clock signal (phase difference) as a function of time variant changes in a magnitude of a power supply voltage to the digital circuit.

2. The clock distribution circuit of claim 1, wherein β is constrained limit the permissible phase difference in accordance with the following expression:

$$d\max \ge \frac{\beta}{2\pi}\max\left|\int(v(t)-v_0)dt\right|$$

$$\beta \le \frac{2\pi d\max}{\max|\int(v(t)-v_0)dt|}$$

where dmax is a maximum quantity of time permitted to be added to or subtracted from the clock signal.

3. The clock distribution circuit of claim 2, wherein the phase adjustment circuit includes:
   a sensing circuit that operates to produce a noise signal indicative of the time variant changes in the magnitude of the power supply voltage;
   a low frequency cut-off circuit that operates to produce a filtered version of the noise signal;
   an integrator circuit that operates to produce an integral of the filtered noise signal as a function of time; and
   a gain circuit that operates to produce the control signal from the integral of the filtered noise signal.

4. The clock distribution circuit of claim 3, wherein:
   the power supply is implemented with a circuit having a chip, package, and/or board parasitic LCR resonance frequency as a function of stray inductances and capacitances within the power supply circuit; and
   a cut-off frequency of the low frequency cut-off circuit is set below the LCR resonance frequency such that β is larger than would otherwise be possible when the cut-off frequency of the low frequency cut-off circuit is set above the LCR resonance frequency.

5. A phase adjustment circuit that operates to receive a clock signal for distribution in an digital circuit and produce a delayed, advanced, or unchanged output clock signal as a function of a control signal, wherein the phase adjustment circuit operates to vary an amount of delay or advancement between the clock signal and the output clock signal as a function of time variant changes in a magnitude of a power supply voltage to the digital circuit, wherein the phase adjustment circuit is operable to vary the phase difference between the clock signal and the output clock as expressed by the following equation:

$$\varphi(t) = -\frac{\beta}{T_0} \int (v(t) - v_0) dt,$$

wherein φ(t) is the phase difference in radians as a function of time variant changes in a magnitude of the power supply voltage v(t), $T_0$ is a cycle time of the clock signal and β is a constrained constant.

6. The phase adjustment circuit of claim 5, wherein β is constrained limit the permissible phase difference in accordance with the following expression:

$$d\max \geq \frac{\beta}{2\pi} \max \left| \int (v(t) - v_0) dt \right|$$

$$\beta \leq \frac{2\pi d\max}{\max \left| \int (v(t) - v_0) dt \right|}$$

where dmax is a maximum quantity of time permitted to be added to or subtracted from the clock signal.

7. A method of distributing a clock signal to a digital circuit, comprising:
producing a clock signal; and
delaying, advanced, or leaving the clock signal unchanged to produce an output clock signal as a function of a control signal, wherein an amount of delay or advancement between the clock signal and the output clock signal (phase difference) is a function of time variant changes in a magnitude of a power supply voltage to the digital circuit, the phase difference between the clock signal and the output clock being expressed by the following equation:

$$\varphi(t) = -\frac{\beta}{T_0} \int (v(t) - v_0) dt,$$

wherein φ(t) is the phase difference in radians as a function of time variant changes in a magnitude of the power supply voltage v(t), $T_0$ is a cycle time of the clock signal and β is a constrained constant.

8. The method of claim 7, further comprising distributing the output clock signal to a plurality of areas of a digital circuit using a clock distribution tree.

9. The method of claim 7, wherein β is constrained limit the permissible phase difference in accordance with the following expression:

$$d\max \geq \frac{\beta}{2\pi} \max \left| \int (v(t) - v_0) dt \right|$$

$$\beta \leq \frac{2\pi d\max}{\max \left| \int (v(t) - v_0) dt \right|}$$

where dmax is a maximum quantity of time permitted to be added to or subtracted from the clock signal.

10. The method of claim 9, further comprising:
producing a noise signal indicative of the time variant changes in the magnitude of the power supply voltage;
producing a filtered version of the noise signal; and
integrating the filtered noise signal as a function of time to produce a signal indicative of the control signal.

11. The method of claim 10, wherein:
the power supply is implemented with a circuit having a chip, package, and/or board parasitic LCR resonance frequency as a function of stray inductances and capacitances within the power supply circuit; and
the method further comprises filtering the noise signal below the LCR resonance frequency such that β is larger than would otherwise be possible when filtering the noise signal above the LCR resonance frequency.

* * * * *